United States Patent [19]
DeMeester et al.

[11] Patent Number: 5,675,305
[45] Date of Patent: Oct. 7, 1997

[54] MULTIPLE DRIVEN C MAGNET

[75] Inventors: Gordon D. DeMeester, Wickliffe; Michael A. Morich, Mentor, both of Ohio

[73] Assignee: Picker International, Inc., Highland Heights, Ohio

[21] Appl. No.: 682,426

[22] Filed: Jul. 17, 1996

[51] Int. Cl.$^6$ .................................................. H01F 7/22
[52] U.S. Cl. ............................................................ 335/302
[58] Field of Search ........................... 335/216, 296–301, 335/304, 302; 324/318–320; 128/653 SC, 653 R, 653 A; 505/892, 893

[56] References Cited

U.S. PATENT DOCUMENTS

| | | |
|---|---|---|
| 2,962,636 | 11/1960 | Purcell . |
| 4,359,706 | 11/1982 | Flack . |
| 4,553,122 | 11/1985 | Young . |
| 4,656,449 | 4/1987 | Mallard et al. . |
| 4,875,485 | 10/1989 | Matsutani . |
| 4,985,678 | 1/1991 | Gangarosa et al. . |
| 5,361,054 | 11/1994 | Knüttel . |

*Primary Examiner*—Aditya Krishnan
*Attorney, Agent, or Firm*—Fay, Sharpe, Beall, Fagan, Minnich & McKee

[57] ABSTRACT

A ferromagnetic flux path (20) extends between pole pieces (30,32). A superconducting coil (62) in series with a persistence switch (64) encircles the flux path. A pair of resistive coils (50,52) are disposed one at each pole piece. The resistive coils are overdriven near to the point of thermal failure to produce a 0.5 T or other preselected field strength in a gap between the pole pieces. The persistence switch is closed to stabilize and hold the flux through the superconducting coil. The resistive magnets are ramped down or shut off. During imaging, a smaller amount of current is directed to the resistive coils to supplement and focus the magnetic field from the superconducting coil through the gap between the poles. In this manner, high strength magnetic fields are generated in the gap using a relatively inexpensive combination of resistive and superconducting coils.

16 Claims, 2 Drawing Sheets

MULTIPLE DRIVEN C MAGNET

BACKGROUND OF THE INVENTION

The present invention relates to the art of generating magnetic fields, particularly, strong uniform magnetic fields between opposed pole pieces that are connected by an iron return path. It finds particular application with magnetic resonance imaging and will be described with particular reference thereto. However, it is to be appreciated that the present invention will also find application with magnetic resonance spectroscopy, and other medical and diagnostic techniques, and the like.

In a magnetic resonance imaging system, a homogeneous magnetic field is provided over the imaging volume. A fringe field in excess of five Gauss arising from the system magnet is limited to regions in the immediate neighborhood of the imager.

Heretofore, most magnetic resonance imagers have generated the main or primary magnetic field axially through an air core within a plurality of annular magnetic coils. However, this air core design is relatively inefficient compared to an iron core magnet. An air core design is best suited for superconducting magnets since it requires a large number of ampere-turns compared to an iron core magnet. Iron core magnets can be designed to have well-contained fringe fields, be relatively inexpensive, have improved patient access, and have the ability to easily cycle the energization.

Others have heretofore constructed C, double-C, H and picture frame iron core electromagnets for magnetic resonance applications. However, these are typically very heavy. Even a relatively low field C-magnet, e.g. 0.2 Tesla, has a very large mass in the iron return path or ferromagnetic path. Although the yoke of the iron return path could be positioned close to the poles to minimize weight, the return path effects tended to distort the magnetic field across the gap. Therefore, the return path was positioned well away from the gap thus necessitating an increase in the cross-section, overall length and therefore weight of the magnet. The dual return paths of a double-C, H or picture frame magnet tended to improve the symmetry and hence uniformity in the gap or imaging volume.

As the field strength and gap distance increased, the cross-section of the return path was also increased. The weight of the iron core increased approximately as the cube of the pole spacing of the gap and linearly with the field strength. Due to this severe weight penalty, the gap of such magnets was minimized. In magnets built for human imaging, the gaps were arranged vertically to accommodate the smallest front-to-back dimension of a reclining human body.

Increasing electrical current through resistive driving coils in a C magnet seems at first a solution to the problem of increasing field strength without decreasing gap size or increasing the iron core dimensions. However, this significantly increases the power consumption of the magnetic resonance system. The magnetic field strength of an iron core electromagnet (units of ampere-turns) can be increased by adding more current or turns. However, the power dissipation in the driving coils increases as the square of the applied current. Additional turns (also with less favorable geometry) increases the resistive loss in the excitation coils. To make matters much worse, the field does not scale with the increased number of amperes or turns because of saturation effects in the iron core. There are practical limits to the field strength of a resistive electromagnet based on acceptable geometry and power dissipation. This also influences system complication as well as cost of manufacture and operation. Further, thermal dissipation from the resistive coils becomes a severe problem.

As an example, a prior art C magnet for imaging at 0.2 T having poles of 1.0 m diameter with a 0.5 m gap therebetween requires approximately 60,000 ampere turns around the ferromagnetic return leg. To drive such a magnet to 0.5 T requires many times the power. At such power levels, thermal dissipation becomes a severe problem. In fact, such an overdriven magnet would be self-destructive.

One alternative is to provide a superconducting coil behind each pole piece. At 0.5 T, the superconducting coil is small, however, the cryostat therefor adds complexity. The cyrostat contains liquid helium reserve. The coils are connected in series and suspended to withstand the magnetic forces. With multiple cryostats, persistent mode excitation and coordination leads to complications and expense. Of course, thermal and electrical conduction paths between the superconducting coils are possible but they add further complication and expense to the cryostat.

The present invention contemplates a new and improved magnetic apparatus and method which overcomes the above-referenced problems and others.

SUMMARY OF THE INVENTION

In accordance with the present invention, a magnetic resonance imaging system further includes a magnetomotive force means for producing magnetic flux in the ferromagnetic flux path, and a magnetic flux stabilizing means for stabilizing the magnetic flux in at least a portion of the ferromagnetic path.

In accordance with a more limited aspect of the invention, the magnetic flux stabilizing means includes a superconductor.

Further, in accordance with the invention, the magnetomotive force means includes a resistive magnet.

Still further, the magnetic flux stabilizing means includes a persistence switch.

Further, the magnetic diagnostic apparatus has a failure control to ensure that the magnetomotive force means does not overheat.

A primary advantage of the present invention is that it generates a strong, uniform, and stable magnetic field. Another advantage of the present invention resides in the open space around the patient which facilitates range of motion studies and other procedures, invasive procedures, connection of life support equipment, and reduces patient claustrophobia.

A further advantage resides in its compact size.

Another advantage resides in its moderate cost.

Still further advantages of the present invention will become apparent to those of ordinary skill in the art upon reading and understanding of following detailed description of the preferred embodiments.

BRIEF DESCRIPTION OF THE DRAWINGS

The invention may take form in various parts and arrangement of parts. The drawings are only for purposes of illustrating preferred embodiments and are not to be construed as limiting the invention.

DETAILED DESCRIPTION OF THE PREFERRED EMBODIMENT

Figure 1:
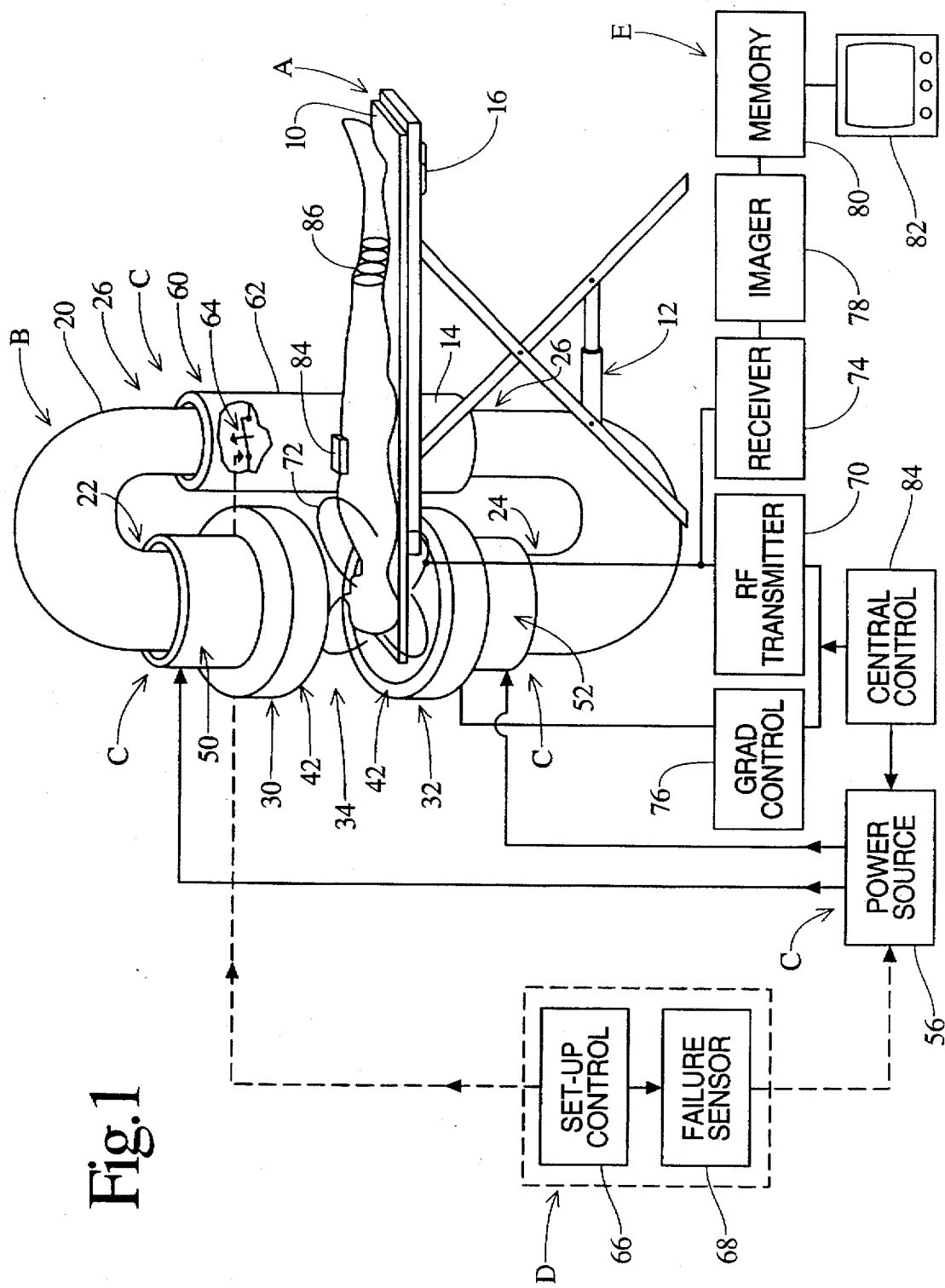
FIG. 1 is a diagrammatic illustration of a magnetic resonance imaging apparatus in accordance with the present invention.

With reference to FIG. 1, a support A selectively supports a patient or subject in an air gap defined between pole faces of a C-shaped ferromagnetic flux path B. A magnetomotive force means and magnetic flux stabilizing means C creates and stabilizes a magnetic field across the air gap between the pole faces and along the ferromagnetic flux path B. A one-time energizing and calibration system D is used to set up the magnetic field across the air gap. Magnetic resonance electronics E selectively induce magnetic resonance of dipoles in the image region and process resultant received magnetic resonance signals to create an image or other diagnostic information.

The support A includes a supporting surface 10 in a substantially horizontal plane. The supporting surface has a longitudinal axis lengthwise therealong and a perpendicular transverse axis thereacross, both in the horizontal plane. An elevation adjusting means selectively adjusts the relative height of the supporting surface. The supporting surface is slidably mounted on a support frame 14 to provide a means for moving the supporting surface in the horizontal plane. Preferably, a motor drive 16 is mounted to the frame to drive the patient supporting surface therealong.

The ferromagnetic flux path B includes a C-shaped ferromagnetic member 20 having a first end 22, a second end 24, and a middle portion 26. A first pole piece 30 and a second pole piece 32 at the first and second ends of the flux path, respectively, define an air gap 34 therebetween. The C-shaped member is configured to minimize the length of the ferromagnetic flux path while spacing the ferromagnetic flux path sufficiently from the gap to minimize distortion to the magnetic field in the air gap.

Figure 2:
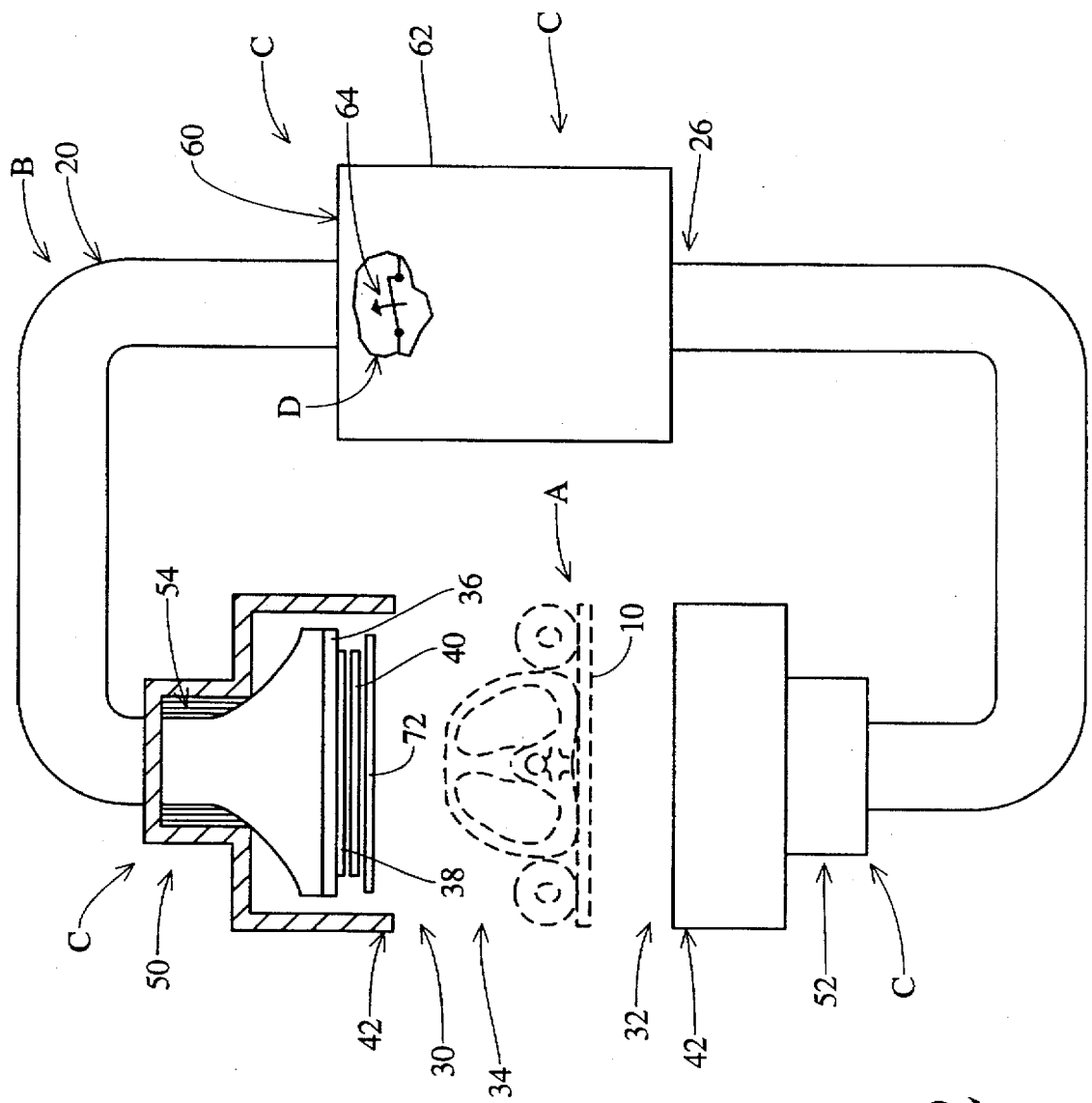
FIG. 2 is partial cross-sectional view illustrating the resistive and gradient coil details of the apparatus of FIG. 1.

The ferromagnetic flux path can be solid, laminated, include an air core or the like. In the embodiment of FIG. 2, the ferromagnetic flux path is a C-shaped iron core having flared ends toward the pole pieces to provide a smooth transition between the iron core and the larger cross-section pole pieces which may be circular, oval, rectangular, or the like.

The C-shaped member preferably consists of iron or an iron-cobalt alloy but may also consist of another metal, alloy or compound of the transition, rare-earth, and acitinide elements. In addition, various other configurations for the ferromagnetic flux path are contemplated including double-C shaped members, which define two return flux paths as well as configurations with a larger number of flux paths.

With reference to FIG. 2, the pole pieces each include a soft ferrite or laminated pole face 36 configured to suppress eddy currents, and passive shims and/or active shim coils 38. The active shim coil is iteratively adjusted until a magnetic field between the pole pieces is optimized. The shimming also compensates for edge effects, pole face irregularities, the presence of the yoke, the influence of the room and other adjoining equipment, and the like.

A gradient field coil 40 selectively produces substantially linear gradients aligned with the field or magnetic flux in the air gap. The gradient coil includes appropriate coil segments to create orthogonal gradients in the field within the air gap that are appropriate for imaging.

The magnetomotive force means and magnetic flux stabilizing means C includes, as the magnetomotive force means, two resistive magnet drivers 50, 52 disposed adjacent pole pieces 30, 32. Each resistive driver includes a resistive coil 54 consisting of a thin, wide, insulated conductor. Each resistive coil wraps annularly around a respective end of the C-shaped member. Optionally, each resistive coil is cooled at its edges using a water-cooling device (not shown) to prevent overheating. The resistive coil is energized and deenergized through a current lead by excitation power source 56 (shown in FIG. 1).

Alternatively, one or more resistive drivers may be located at any position along the C-shaped member. Further, other magnetic field generating arrangements, such as permanent magnets can be utilized.

The magnetomotive force means and magnetic flux stabilizing means C also includes, as the magnetic flux stabilizing means, a superconducting cryodriver 60 which encircles a segment of the middle portion 26 of the C-shaped member. As is well known by those skilled in the art, the cryodriver includes a cryostat 62 which houses an annular superconductor magnet that encircles the flux path. The cryostat also holds a coolant around the superconductor to maintain its superconductivity. Preferably, the superconductor is a Niobium-Titanium alloy and the coolant is liquid helium. However, it will be appreciated that other superconductors and, if necessary, their coolants may be used without departing from the scope of the invention.

The superconductor is in the form of closed circuit including a persistence switch 64. When the persistence switch is non-resistive (superconducting) or closed, the superconducting magnet maintains constant the magnetic flux passing therethrough. When the persistence switch is resistive or open, the superconducting magnet loses superconductivity and does not maintain the magnetic field.

Returning to FIG. 1, to set up the main magnetic field in the C-shaped member, the energizing and calibration system D is used. The system includes a set-up control 66 which directs the power source 56 to energize or apply current to the resistive drivers 50, 52 while the persistence switch 64 is resistive. For the full benefit of the invention, the resistive drivers are overdriven near to the point of overheating. Failure control 68 ensures that the resistive drivers do not overheat to the point of failure. The failure control may incorporate one of a number of devices such as a timer, a thermocouple or field strength indicator located adjacent the resistive coils, or a computer simulator which monitors the power or field strength at the coils and computes the point of temperature failure.

The set-up control is also attached to the persistence switch 64. When a desired magnetic field, such as 0.5 T, is achieved in the gap or in the superconducting driver, the persistence switch is closed. This in effect freezes the strength of the magnetic field in the portion of the flux path surrounded by the superconducting driver. Any changes in the magnetic field strength induces opposing currents in the superconductor, thus stabilizing the field strength.

To focus as much of the magnetic field in the middle portion of the C-shaped ferromagnetic member, the superconducting coil should be as close as possible to the member. One way to achieve this is to incorporate a section of the middle portion of the C-shaped ferromagnetic member into the cryodriver, such as in the cold shields.

Optionally, a magnetic field strength detector can be used to monitor the field in the air gap and indicate when the persistence switch should be closed. After the persistence switch is closed, the resistive drivers are ramped down to a lower level or to zero which lowers, but does not extinguish, the field strength in the air gap. Although the resistive drivers were overdriven to initialize the superconducting magnet, only moderate power in the resistive coils reestablishes the desired field strength in the air gap.

The resistive coils, their configuration, and any cooling system are selected to permit the resistive coils to generate, at least for a moment, the desired magnetic field in the gap without assistance from the superconducting magnet. In the alternative, or in conjunction, power may be supplied to the superconducting coil to assist in establishing the desired magnetic field.

Once the desired magnetic field strength is established in the superconductor, the energizing and calibration system D is disconnected from the magnetomotive force and magnetic flux stabilizing means C. Should the need arise to remagnetize and stabilize the magnetic flux stabilizing means, the system D is reconnected.

The electronics section E includes an radio frequency (RF) transmitter means 70 which selectively applies radio frequency pulses to a radio frequency coil 72 to excite magnetic resonance of dipoles in the gap magnetic field. A receiver 74 receives magnetic resonance signals from the region of interest using the radio frequency coil 72 as an antenna. A gradient coil control 76 applies electrical pulses to the gradient field coil 40 to cause gradients across the gap magnetic field to encode the magnetic resonance signals. An image reconstruction processor 78 performs an inverse two-dimensional Fourier transform or other known algorithm to reconstruct an image representation from the received magnetic resonance signals. The image representations are stored in a memory 80, displayed on a video monitor 82, further processed, or the like. A central magnetic resonance controller 84 controls the excitation power control 56 to the resistive drivers, the RF transmitter 70, the gradient field control 76 to implement a preselected magnetic resonance imaging sequence as is conventional in the art.

Rather than using the same coil for transmission and reception, surface coils such as a coil loop 84 or solenoid coil 86 may be disposed in the image region and used to receive the magnetic resonance signals. A wide variety of radio frequency coils are contemplated including crossed ellipse quadrature coils, saddle quadrature coils, solenoid coils, saddle coils, butterfly coils, phased array coils, or the like.

The invention has been described with reference to the preferred embodiments. Obviously, modifications and alterations will occur to others upon reading and understanding the preceding detailed description of the preferred embodiment. It is intended that the invention be construed as including all such alterations and modifications insofar as they come within the scope of the appended claims or the equivalents thereof.

Having thus described the preferred embodiment, the invention is now claimed to be:

1. A magnetic resonance imaging system having a ferromagnetic flux path for producing magnetic flux in an examination region, a radio frequency pulse controller and transmitter for inducing dipoles in the examination region to resonance such that radio frequency resonance signals are generated, gradient magnetic field coils and a gradient magnetic field controller for generating at least phase and read magnetic field gradient pulses in orthogonal directions across the examination region, a receiver for receiving and demodulating the radio frequency magnetic resonance signals, and an image processor for reconstructing image representations, and further including:

a magnetomotive force means for producing magnetic flux in the ferromagnetic flux path;

a magnetic flux stabilizing means for stabilizing the magnetic flux in at least a portion of the ferromagnetic path.

2. The magnetic resonance imaging system as set forth in claim 1, wherein:

the magnetic flux stabilizing means includes a superconducting magnet.

3. The magnetic resonance imaging system as set forth in claim 2, wherein the magnetomotive force means includes a resistive magnet.

4. The magnetic resonance imaging system as set forth in claim 3, wherein:

the magnetic flux stabilizing means includes a persistence switch.

5. The magnetic resonance imaging system as set forth in claim 4, further including:

a failure control to ensure that the magnetomotive force means does not overheat.

6. A magnetic resonance method for use in a system which includes a subject receiving region, a pair of poles disposed on opposite sides of the subject receiving region, a ferromagnetic flux path connecting the poles, a superconducting coil magnetically coupled along the ferromagnetic flux path, and additional coils magnetically coupled adjacent the poles, the method comprising:

(a) magnetically decoupling the superconducting coil from the ferromagnetic flux path;

(b) producing a selected magnetic flux in the ferromagnetic flux path with the additional coils;

(c) magnetically coupling the superconducting coil to the ferromagnetic flux path such that the superconducting coil holds the magnetic flux therethrough constant; and (d) ramping down the magnetic flux produced by the additional coils.

7. The method as set forth in claim 6, further including:

overdriving the additional coils near to the point of failure to produce selected magnetic flux in the ferromagnetic flux path.

8. The method as set forth in claim 7, wherein the superconducting coil is connected to a switch which is closed to permit current flow through the coil and open to block current flow and wherein:

the step of decoupling the superconducting coil from the ferromagnetic flux path includes opening the switch; and, the step of magnetically coupling the superconducting coil to the ferromagnetic flux path includes closing the switch.

9. The method as set forth in claim 6 wherein the additional coils are resistive coils and the step of producing the selected magnetic flux includes:

overdriving the resistive coils near to the point of failure due to overheating.

10. The method as set forth in claim 6 further including:

adjusting the magnetic flux produced by the additional coils until a preselected field strength is achieved in the subject receiving region;

exciting resonance in selected dipoles in the subject receiving region and spatially encoding resonance signals produced by the resonating dipoles;

reconstructing the spatially encoded resonance signals into an image representation.

11. A magnetic resonance apparatus comprising:

a subject support which supports a subject in a subject receiving region;

first and second pole pieces disposed on opposite sides of the subject receiving region;

a ferromagnetic flux path interconnecting the first and second pole pieces;

a superconducting magnet disposed along the ferromagnetic flux path and maintaining a preselected magnetic flux therethrough;

first and second additional magnets disposed adjacent the first and second pole pieces, respectively, for adjusting a magnetic field strength through the subject receiving region.

12. The magnetic resonance apparatus as set forth in claim 11 wherein the superconducting magnet includes:

a superconducting coil which surrounds the ferromagnetic flux path.

13. The magnetic resonance apparatus as set forth in claim 12 wherein the superconducting coil further includes:

a switch which in a closed state permits superconducting current to flow through the superconducting coil and in an open state prevents current from flowing through the coil.

14. The magnetic resonance apparatus as set forth in claim 13 wherein the additional coils are resistive coils.

15. The magnetic resonance apparatus as set forth in claim 14 further including:

a magnet control system for overdriving the resistive coils with the switch open until a preselected magnetic field strength is achieved in the subject receiving region, closing the superconducting switch when the preselected field strength is received, and reducing the magnetic flux produced by the resistive coils.

16. The magnetic resonance apparatus as set forth in claim 11 further including:

a radio frequency transmitter for exciting selected dipoles in the subject receiving region to resonance;

gradient magnetic field coils for spatially encoding resonance signals generated by the resonating dipoles;

a receiver for receiving the spatially encoded resonance signals;

an image processor for reconstructing the received spatially encoded resonance signals into an image representation.

* * * * *